(12) United States Patent
Han (10) Patent No.: US 9,356,605 B2
(45) Date of Patent: May 31, 2016

(54) PERIOD MEASURING CIRCUIT AND SEMICONDUCTOR DEVICE INCLUDING THE SAME

(71) Applicant: SK hynix Inc., Gyeonggi-do (KR)

(72) Inventor: Min-Sik Han, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/572,254

(22) Filed: Dec. 16, 2014

(65) Prior Publication Data

US 2016/0043727 A1 Feb. 11, 2016

(30) Foreign Application Priority Data

Aug. 6, 2014 (KR) .................. 10-2014-0100829

(51) Int. Cl.
*G01R 23/10* (2006.01)
*G01R 31/317* (2006.01)
*H03K 21/08* (2006.01)

(52) U.S. Cl.
CPC ............... *H03K 21/08* (2013.01); *G01R 23/10* (2013.01); *G01R 31/31727* (2013.01)

(58) Field of Classification Search
CPC ... G01R 23/02; G01R 23/10; G01R 31/31727
See application file for complete search history.

(56) References Cited

U.S. PATENT DOCUMENTS

| 3,609,326 | A  | * | 9/1971  | Bagley    | G01R 23/10 324/76.48 |
| 4,800,508 | A  | * | 1/1989  | Frederich | G01R 23/02 324/76.39 |
| 6,597,205 | B2 | * | 7/2003  | Powell    | G01R 23/10 327/48 |
| 8,072,207 | B2 | * | 12/2011 | Pieber    | G01R 23/10 324/76.11 |
| 2010/0169045 | A1 | * | 7/2010 | Shin      | G01R 31/2882 702/179 |

FOREIGN PATENT DOCUMENTS

KR 1020080088044 10/2008

* cited by examiner

*Primary Examiner* — Patrick O'Neill
(74) *Attorney, Agent, or Firm* — IP & T Group LLP (57) ABSTRACT

A semiconductor device includes: a counting detection block suitable for generating a counting value of a clock signal transmitted through a first transmission path and a counting value of a target signal transmitted through a second transmission path during a counter enable section, and blocking the first transmission path and the second transmission path based on a comparison result obtained by comparing a predetermined code value with the counting value of the clock signal; and an output block suitable for outputting the counting value of the target signal corresponding to when the first and second transmission paths to a predetermined pad are blocked, based on a test mode signal.

16 Claims, 4 Drawing Sheets

PERIOD MEASURING CIRCUIT AND SEMICONDUCTOR DEVICE INCLUDING THE SAME

CROSS-REFERENCE TO RELATED APPLICATIONS

The present application claims priority of Korean Patent Application No. 10-2014-0100829, filed on Aug. 6, 2014, which is incorporated herein by reference in its entirety.

BACKGROUND

1. Field

Various embodiments of the present invention relate to a semiconductor design technology, and more particularly, to a period measuring circuit using counters and a semiconductor device including the same.

2. Description of the Related Art

In general, to measure a period of a signal, a counter which counts the toggling of a reference clock signal during a predetermined section of the signal, may be used.

When an enabling section for performing a counting operation of a counter is not properly set, the maximum counting value of the counter may be exceeded and the counter is initialized. Consequently, an error may occur in the measurement of a period. For example, when the counter is set to be enabled for too long, the range of a measurement error may be reduced in the measurement of a period of a target signal to be measured. However, the target signal continues to be inputted, and therefore, an overflow in which the counter exceeds the maximum counting value and the counter is initialized may occur. Such an overflow causes concerns in that a period of a target signal may not be properly measured.

SUMMARY

Various embodiments of the present invention are directed to to a period measuring circuit that may prevent an overflow of a counter from occurring when a period of the target signal is measured, so that a measurement error of a target signal may be reduced, and a semiconductor device including the same.

In accordance with an embodiment of the present invention, a semiconductor device includes: a counting detection block suitable for generating a counting value of a clock signal transmitted through a first transmission path and a counting value of a target signal transmitted through a second transmission path during a counter enable section, and blocking the first transmission path and the second transmission path based on a comparison result obtained by comparing a predetermined code value with the counting value of the clock signal; and an output block suitable for outputting the counting value of the target signal corresponding to when the first and second transmission paths are blocked to a predetermined pad based on a test mode signal, The counting detection block may include: a first counter suitable for performing a counting operation of the clock signal transmitted through the first transmission path during the counter enable section; a second counter suitable for performing a counting operation of the target signal transmitted through the second transmission path during the counter enable section; and a flag signal generation unit suitable for comparing the predetermined code value with a counting value outputted from the first counter, generating a flag signal when the predetermined code value is the same as the counting value outputted from the first counter and blocking the first and second transmission paths based on the flag signal.

The counting detection block further may include: a clock signal transmission unit suitable for receiving the flag signal and the clock signal and transmitting the clock signal to the first counter when the flag signal is deactivated; and a target signal transmission unit suitable for receiving the flag signal and the target signal and transmitting the target signal to the second counter when the flag signal is deactivated.

The clock signal transmission unit may set the clock signal to a predetermined level and transmits the set clock signal to the first counter when the flag signal is activated.

The target signal transmission unit may set the target signal to a predetermined level and transmit the set target signal to the second counter when the flag signal is activated.

The output block may include: an output enable signal generation unit suitable for receiving the test mode signal and generating an output signal after the counter enable section; an input/output line transmission unit suitable for transmitting the counting value of the second counter to an input/output line based on the output signal; and an output driving unit suitable for outputting the counting value transmitted to the input/output line to the predetermined pad in response to a read command.

In accordance with another embodiment of the present invention, a semiconductor device includes: a counting detection block suitable for generating a counting value of a clock signal transmitted through a first transmission path and a counting value of a target signal transmitted through a second transmission path during a counter enable section and blocking the first transmission path and the second transmission path based on a flag signal generated based on a comparison result obtained by comparing a predetermined code value with the counting value of the clock signal; and an output block suitable for outputting the counting value of the target signal corresponding to an enabling moment of the flag signal to a predetermined pad when the flag signal is activated.

The counting detection block may include: a first counter suitable for performing a counting operation on the clock signal transmitted through the first transmission path during the counter enable section; a second counter suitable for performing a counting operation on the target signal transmitted through the second transmission path during the counter enable section; and a flag signal generation unit suitable for comparing the predetermined code value with a counting value outputted from the first counter, generating a flag signal when the predetermined code value is the same as the counting value outputted from the first counter and blocking the first and second transmission paths based on the flag signal.

The flag signal generation unit may enable the flag signal when the predetermined code value is the same as the counting value of the first counter and disables the flag signal when the predetermined code value is not the same as the counting value of the first counter.

The counting detection block may further include: a clock signal transmission unit suitable for receiving the flag signal and the clock signal and transmitting the clock signal to the first counter when the flag signal is deactivated; and a target signal transmission unit suitable for receiving the flag signal and the target signal and transmitting the target signal to the second counter when the flag signal is deactivated.

The clock signal transmission unit may set the clock signal to a predetermined level and transmits the set clock signal to the first counter when the flag signal is activated.

The target signal transmission unit may set the target signal to a predetermined level and transmits the fixed target signal to the second counter when the flag signal is activated.

The output block may include: a latching unit suitable for latching the counting value of the second counter when the flag signal is deactivated and outputting the latched counting value of the second counter when the flag signal is activated; and an output driving unit suitable for outputting the counting value transmitted from the latching unit to the predetermined pad in response to a read command.

In accordance with another embodiment of the present invention, a method for operating a semiconductor device includes: performing counting operations on a clock signal and a target signal during a counter enable section; blocking the counting operations when a predetermined code value is the same as a counting value of the clock signal; outputting a counting value of the target signal corresponding to when the counting operations are blocked; and measuring a period of the target signal based on the predetermined code value and the counting value of the target signal.

In accordance with another embodiment of the present invention, a period measuring circuit includes: a clock signal transmission unit suitable for selectively transmitting a clock signal as a first counting signal based on a counter enable signal and a flag signal; a first counter suitable for counting the first counting signal to output a first counting value; a flag signal generation unit suitable for comparing the first counting value with a predetermined code to generate the flag signal; a target signal transmission unit suitable for selectively transmitting a target signal as a second counting signal based on the counter enable signal and the flag signal; and a second counter suitable for counting the second counting signal to output a second counting value.

The clock signal and the target signal may be blocked when the first counting signal is the same as the predetermined code value.

DETAILED DESCRIPTION

Exemplary embodiments of the present invention are described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an to intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

Figure 1:
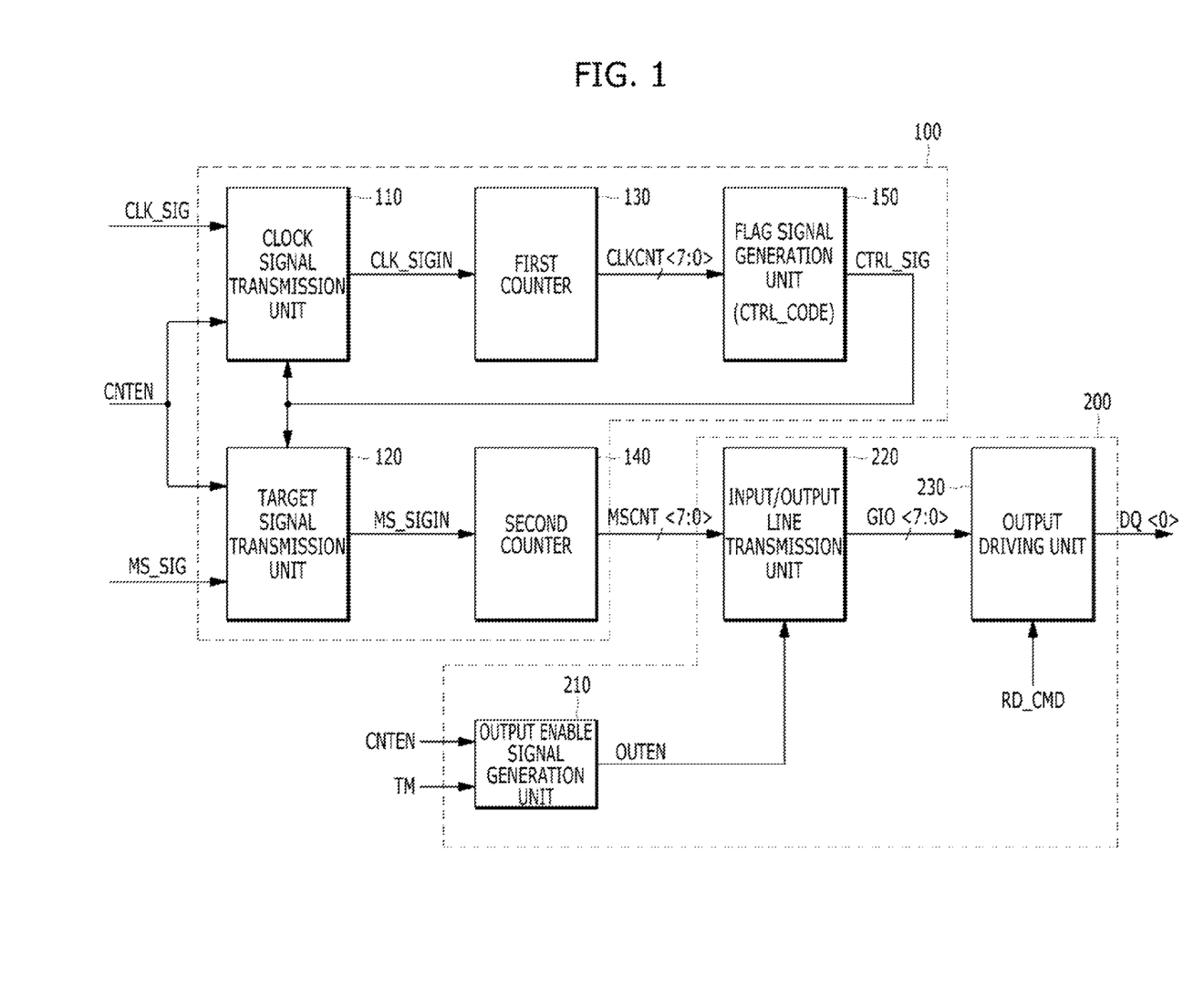
FIG. 1 is a block diagram illustrating a semiconductor device in accordance with an embodiment of the present invention.

FIG. 1 is a block diagram illustrating a semiconductor device in accordance with an embodiment of the present invention.

Referring to FIG. 1, the semiconductor device may include a counting detection block 100 and an output block 200. The counting detection block 100 may include a clock signal transmission unit 110, a target signal transmission unit 120, a first counter 130, a second counter 140, and a flag signal generation unit 150.

The clock signal transmission unit 110 may receive a clock signal CLK_SIG, a counter enable signal CNTEN and a flag signal CTRL_SIG from the flag signal generation unit 150 and transmit the clock signal CLK_SIG to the first counter 130. The clock signal CLK_SIG is a reference clock signal that toggles at a predetermined period or a predetermined frequency. The counter enable signal CNTEN may be activated when the period of the target signal is measured. The clock signal transmission unit 110 may output the clock signal CLK_SIG as a first counting signal CLK_SIGIN based on the flag signal CTRL_SIG. The flag signal CTRL_SIG is a signal indicating whether or not an overflow of the first counter 130 occurs. When the flag signal CTRL_SIG is activated, the clock signal transmission unit 110 may fix and output the first counting signal CLK_SIGIN at a predetermined level regardless of the clock signal CLK_SIG.

The target signal transmission unit 120 may receive a target signal MS_SIG, the counter enable signal CNTEN and the flag signal CTRL_SIG from the flag signal generation unit 150 and transmit the target signal MS_SIG to the second counter 140. The target signal MS_SIG is a signal to be measured and it may be outputted from a ring oscillator, for example, a self-refresh oscillator. The target signal transmission unit 120 may output the target signal MS_SIG as a second counting signal MS_SIGIN based on the flag signal CTRL_SIG. When the flag signal CTRL_SIG is activated, the target signal transmission unit 120 may fix and output the second counting signal MS_SIGIN at a predetermined level regardless of the target signal MS_SIG.

The first counter 130 may receive the first counting signal CLK_SIGIN from the clock signal transmission unit 110 and perform a counting operation based on the first counting signal CLK_SIGIN. That is, the first counter 130 may perform a counting operation on the clock signal CLK_SIG transmitted through the clock signal transmission unit 110 which is a first transmission path during a section where the counter enable signal CNTEN is activated. The first counter 130 may output a first counting value CLKCNT<7:0> through a counting operation on the first counting signal CLK_SIGIN. The first counting value CLKCNT<7:0> may mean a code value indicating the counted number of toggling times of the first counting signal CLK_SIGIN.

The second counter 140 may receive the second counting signal MS_SIGIN from the target signal transmission unit 120 and perform a counting operation based on the second counting signal MS_SIGIN. The second counter 140 may perform a counting operation on the target signal MS_SIG transmitted through the target signal transmission unit 120 which is a second transmission path during the section where the counter enable signal CNTEN is activated. The second counter 140 may output a second counting value MSCNT<7:0> through a counting operation on the second counting signal MS_SIGIN. The second counting value MSCNT<7:0> may mean a code value indicating the counted number of toggling times of the second counting signal MS_SIGIN.

The flag signal generation unit 150 may receive the first counting value CLKCNT<7:0> from the first counter 130. The flag signal generation unit 150 may compare a predetermined code value CTRL_CODE with the first counting value CLKCNT<7:0> received from the first counter 130 and block the first and second transmission paths based on the comparison result. The predetermined code value CTLR_CODE may be set as a comparison target of the first counting value CLKCNT<7:0>. A predetermined code value less than the maximum counting value of the first counter 130 may be stored in a register such as a Mode Register Set (MRS), which is set by a device designer in advance, and the predetermined code value CTRL_CODE may change based on the stored value. The predetermined code value CTRL_CODE may be set differently based on the number of bits of the first counter 130.

The flag signal generation unit 150 may deactivate the flag signal CTRL_SIG when the first counting value CLKCNT<7:0> is not the same as the predetermined code value CTRL_CODE and activate the flag signal CTRL_SIG when the first counting value CLKCNT<7:0> is the same as the predetermined code value CTRL_CODE. The flag signal generation unit 150 may output the flag signal CTRL_SIG to the clock signal transmission unit 110 and the target signal transmission unit 120.

For example, when the deactivated flag signal CTRL_SIG in the flag signal generation unit 150 is outputted to the clock signal transmission unit 110, the first counting signal CLK_SIGIN may be transmitted to the first counter 130 based on the clock signal CLK_SIG, the counter enable signal CNTEN and the deactivated flag signal CTRL_SIG, and the first counter 130 may perform a counting operation. When the deactivated flag signal CTRL_SIG in the flag signal generation unit 150 is outputted to the target signal transmission unit 120, the second counting signal MS_SIGIN may be transmitted to the second counter 140 based on the target signal MS_SIG, the counter enable signal CNTEN and the deactivated flag signal CTRL_SIG, and the second counter 140 may perform a counting operation.

When the activated flag signal CTRL_SIG in the flag signal generation unit 150 is outputted to the clock signal transmission unit 110, the first counting signal CLK_SIGIN may be deactivated based on the clock signal CLK_SIG, the counter enable signal CNTEN and the activated flag signal CTRL_SIG. The counting operation of the first counter 130 receiving the deactivated first counting signal CLK_SIGIN may stop. When the activated flag signal CTRL_SIG in the flag signal generation unit 150 is outputted to the target signal transmission unit 120, the second counting signal MS_SIGIN may be deactivated based on the target signal MS_SIG, the counter enable signal CNTEN and the activated flag signal CTRL_SIG. The counting operation of the second counter 140 receiving the deactivated second counting signal MS_SIGIN may stop.

The output block 200 may output the second counting value MSCNT<7:0> of the second counter 140 corresponding to a moment when the first and second transmission paths are blocked to a predetermined data pad DQ<0> based on a test mode signal TM. The output block 200 may include an output enable signal generation unit 210, an input/output line transmission unit 220 and an output driving unit 230.

The output enable signal generation unit 210 may receive the test mode signal TM and generate an output signal OUTEN after the counter enable signal CNTEN is deactivated.

The input/output line transmission unit 220 may receive the second counting value MSCNT<7:0> from the second counter 140 and the output signal OUTEN from the output enable signal generation unit 210. The input/output line transmission unit 220 may transmit the second counting value MSCNT<7:0> to an input/output line GIO based on the output signal OUTEN.

The output driving unit 230 may receive the second counting value MSCNT<7:0> from the input/output line transmission unit 220. The output driving unit 230 may output the second counting value MSCNT<7:0> to the predetermined data pad DQ<0> in response to a read command RD CMD, That is, the second counting value MSCNT<7:0> outputted from the data pad DQ<0> may correspond to the second counting value MSCNT<7:0> at a moment when the flag signal CTRL_SIG is activated, which is a moment at which an overflow is set not to occur while the counting operation on the target signal MS_SIG is performed to measure a period of the second counting value MSCNT<7:0>.

Hereafter, an operation of the semiconductor device is described.

When a period of the target signal MS_SIG is measured, the counter enable signal CNTEN is activated. The clock signal transmission unit 110 and the target signal transmission unit 120 receive the counter enable signal CNTEN, and the clock signal CLK_SIG and the target signal MS_SIG, respectively. Also, the clock signal transmission unit 110 and the target signal transmission unit 120 receive the flag signal CTRL_SIG from the flag signal generation unit 150.

As described, the flag signal generation unit 150 outputs the deactivated flag signal CTRL_SIG until the first counting value CLKCNT<7:0> obtained by counting the clock signal CLK_SIG reaches the predetermined code value CTRL_CODE, and it outputs the activated flag signal CTRL_SIG when the first counting value CLKCNT<7:0> is the same as the predetermined code value CTRL_CODE.

When the first counting value CLKCNT<7:0> does not reach the predetermined code value CTRL_CODE, the clock signal transmission unit 110 and the target signal transmission unit 120 receiving the deactivated flag signal CTRL_SIG, transmit the clock signal CLK_SIG and the target signal MS_SIG to the first counter 130 to and the second counter 140, respectively, based on the activated counter enable signal CNTEN. The first counter 130 performs a counting operation on the first counting signal CLK_SIGIN received from the clock signal transmission unit 110. The second counter 140 performs a counting operation on the second counting signal MS_SIGIN received from the target signal transmission unit 120. The first counter 130 and the second counter 140 output the number of times counted through a counting operation as the first counting value CLKCNT<7:0> and the second counting value MSCNT<7:0>, respectively. The flag signal generation unit 150 compares the first counting value CLKCNT<7:0> with the predetermined code value CTRL_CODE. As a comparison result, when the first counting value CLKCNT<7:0> is not the same as the predetermined code value CTRL_CODE, the flag signal generation unit 150 disables the flag signal CTRL_SIG and continues to perform the counting operations of the first counter 130 and the second counter 140.

Subsequently, when the first counting value CLKCNT<7:0> reaches the predetermined code value CTRL_CODE, the flag signal generation unit 150 outputs the activated flag signal CTRL_SIG. The activated flag signal CTRL_SIG is transmitted to the clock signal transmission unit 110 and the target signal transmission unit 120. The clock signal transmission unit 110 and the target signal transmission unit 120 set the first counting signal CLK_SIGIN and the second counting signal MS_SIGIN to a predetermined level in response to the flag signal CTRL_SIG regardless of the clock signal CLK_SIG and the flag signal MS_SIG. The first counter 130 and the second counter 140 stop performing the counting operations based on the first counting signal CLK_SIGIN and the second input transmission signal MS_SIGIN that do not toggle and have the set level.

After the flag signal CTRL_SIG is activated, the counter enable signal CNTEN may be deactivated, and when the output signal OUTEN is activated based on the test mode signal TM in an external device, the second counting value MSCNT<7:0> received from the second counter 140 is transmitted to the input/output line GIO and outputted to the data pad DQ<0> based on the read command RD_CMD.

When the predetermined code value CTRL_CODE is divided by the second counting value MSCNT<7:0> outputted to the data pad DQ<0>, the percentage of the target signal MS_SIG compared with the clock signal CLK_SIG may be determined. The period of the target signal MS_SIG may be measured based on a clock cycle (tCK) value of the clock signal CLK_SIG.

In the semiconductor device in accordance with the embodiment of the present invention, although the operation times of the first counter 130 and the second counter 140 increase, an overflow of the counter does not occur as the first counter 130 and the second counter 140 are disabled after the counting operation is performed during a predetermined time regardless of the counter enable signal CNTEN. Thus, an error that may occur in measuring a period of the target signal MS_SIG which is a measurement target signal, may be prevented.

Figure 2:
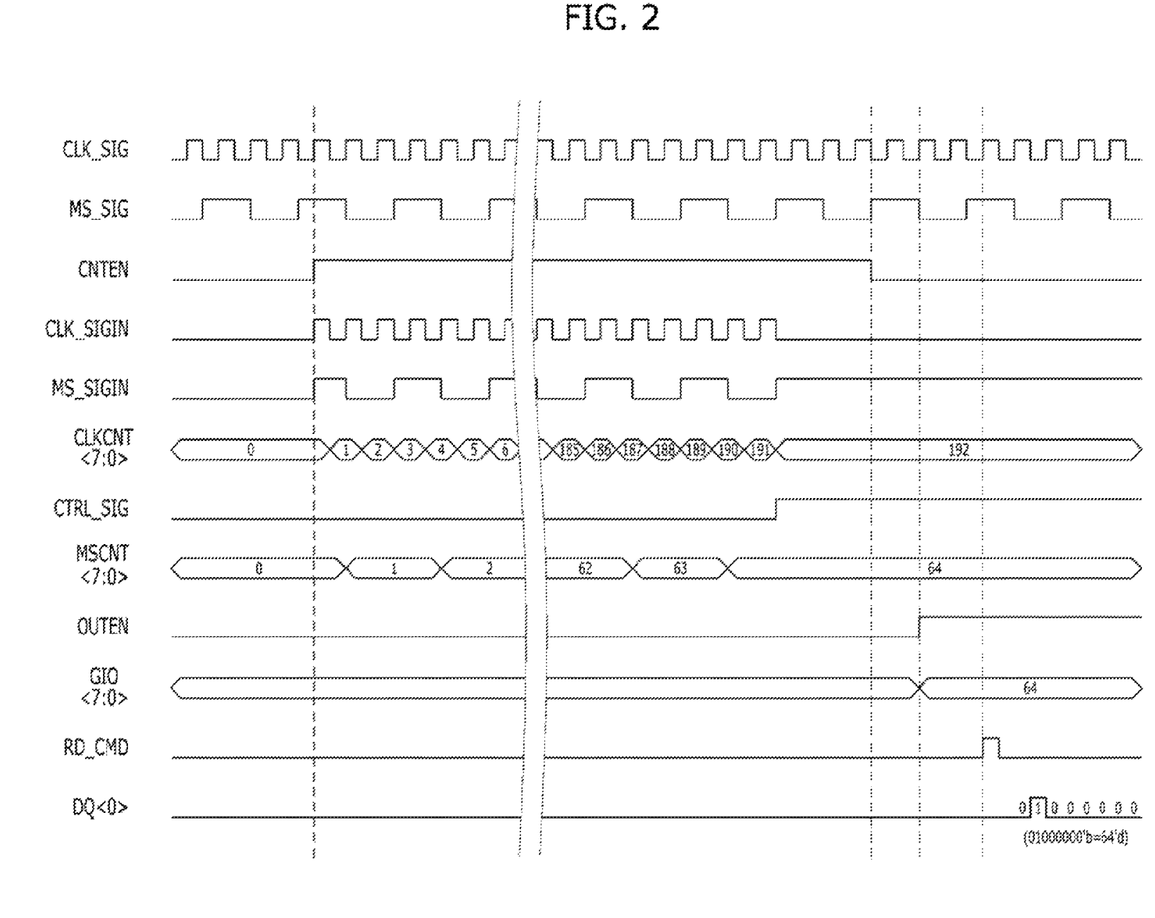
FIG. 2 is a timing diagram for describing an operation of the semiconductor device shown in FIG. 1.

FIG. 2 is a timing diagram for describing an operation of the semiconductor device shown in FIG. 1.

Referring to FIG. 2, an example of the semiconductor device in which the first counter has a 8-bit size, and the predetermined code value is set in the flag signal generation unit 150 to the value of "192" which is a preceding value of the maximum value of "256" that the first counter may count, is described.

The counter enable signal CNTEN measures a period of the target signal MS_SIG,. As the counter enable signal CNTEN is activated, the clock signal CLK_SIG is transmitted as the first counting signal CLK_SIGIN to the first counter and performs a counting operation. As the counter enable signal CNTEN is activated, the target signal MS_SIG is transmitted as the second counting signal MS_SIGIN to the second counter and performs a counting operation. The first and second counters may output their counting values as the first counting value CLKCNT<7:0> and the second counting value MSCNT<7:0> respectively. When the first counting value CLKCNT<7:0> outputted from the first counter is the same as the predetermined code value of "192", the flag signal CTRL_SIG is activated. The first counting signal CLK_SIGIN and the second counting signal MS_SIGIN are fixed at a logic low level, and consequently the counting operations of the first and second counters stop based on the activated flag signal CTRL_SIG. After the flag signal CTRL_SIG is activated, the counter enable signal CNTEN may be deactivated.

After the counter enable signal CNTEN is deactivated, when the test mode signal TM (not shown in FIG. 2) is applied and the output signal OUTEN is activated, the second counting value MSCNT<7:0> is transmitted to the input/output line GIO, and while the output signal OUTEN is activated, the second counting value MSCNT<7:0> loaded on the input/output line GIO is outputted to the data pad DQ<0> in response to the read command RD_CMD. The second counting value MSCNT<7:0> is outputted to the data pad DQ<0> is 64, when there is a 3tCK difference between the second counting value MSCNT<7:0> of "64" and the predetermined code value of "192". A period of the target signal MS_SIG having the 3tCK difference may be measured based on the clock cycle (tCK) value of the clock signal CLK_SIG.

Figure 3:
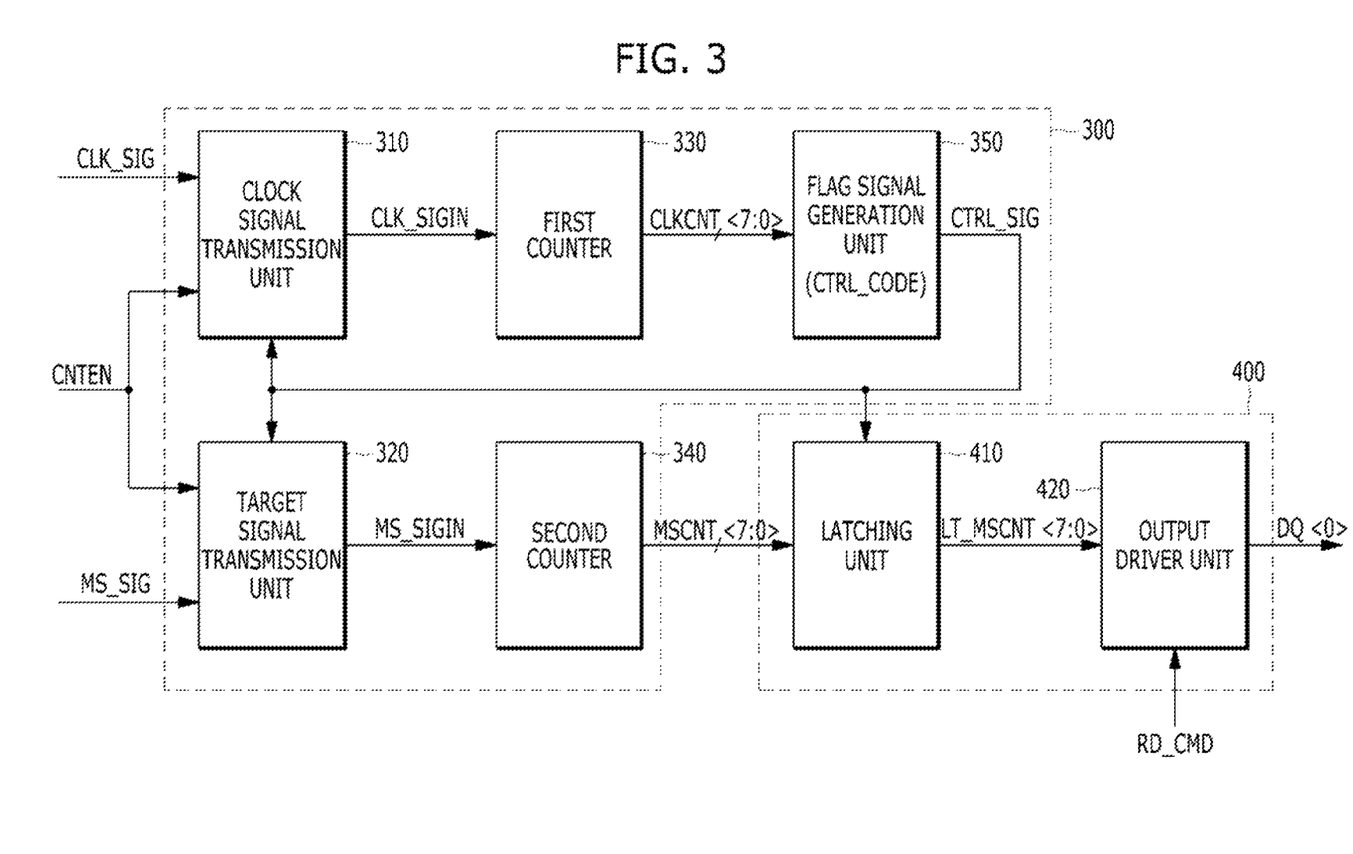
FIG. 3 is a block diagram illustrating a semiconductor device in accordance with an embodiment of the present invention.

FIG. 3 is a block diagram illustrating a semiconductor device in accordance with another embodiment of the present invention.

Referring to FIG. 3, the semiconductor device may include a counting detection block 300 and an output block 400. The counting detection block 300 may include a clock signal transmission unit 310, a target signal transmission unit 320, a first counter 330, a second counter 340, and a flag signal generation unit 350.

The clock signal transmission unit 310 may receive a clock signal CLK_SIG, a counter enable signal CNTEN and a flag signal CTRL_SIG from the flag signal generation unit 350 and transmit the clock signal CLK_SIG to the first counter 330. As described with reference to FIG. 1, the clock signal CLK_SIG is a reference clock signal that toggles at a predetermined period. The counter enable signal CNTEN may be activated when the period of the target signal is measured. The clock signal transmission unit 310 may output the clock signal CLK_SIG as a first counting signal CLK_SIGIN based on the flag signal CTRL_SIG. The flag signal CTRL_SIG is a signal indicating whether or not an overflow of the first counter 330 occurs. When the flag signal CTRL_SIG is activated, the clock signal transmission unit 310 may fix and output the first counting signal CLK_SIGIN at a predetermined level regardless of the clock signal CLK_SIG.

The target signal transmission unit 320 may receive a target signal MS_SIG, the counter enable signal CNTEN and the flag signal CTRL_SIG from the flag signal generation unit 350 and transmit the target signal MS_SIG to the second counter 340. The target signal MS_SIG is a signal to be measured. The target signal transmission unit 320 may output the target signal MS_SIG as a second counting signal MS_SIGIN based on the flag signal CTRL_SIG. When the flag signal CTRL_SIG is activated, the target signal transmission unit 320 may fix and output the second counting signal MS_SIGIN at a predetermined level regardless of the target signal MS_SIG.

The first counter 330 may receive the first counting signal CLK_SIGIN from the clock signal transmission unit 310 and perform a counting operation based on the first counting signal CLK_SIGIN. The first counter 330 may perform a counting operation on the clock signal CLK_SIG transmitted through the clock signal transmission unit 310 which is a first transmission path during a section where the counter enable signal CNTEN is activated. The first counter 330 may output a first counting value CLKCNT<7:0> through a counting operation in response to the first counting signal CLK_SIGIN. The first counting value CLKCNT<7:0> may mean a code value indicating the counted number of toggling times of the first counting signal CLK_SIGIN.

The second counter 340 may receive the second counting signal MS_SIGIN from the target signal transmission unit 320 and perform a counting operation based on the second counting signal MS_SIGIN. The second counter 340 may perform a counting operation on the target signal MS_SIG transmitted through the target signal transmission unit 320 which is a second transmission path during the section where the counter enable signal CNTEN is activated. The second counter 340 may output a second counting value MSCNT<7:0> through a counting operation in response to the second counting signal MS_SIGIN. The second counting value MSCNT<7:0> may mean a code value indicating the counted number of toggling times of the second counting signal MS_SIGIN.

The flag signal generation unit 350 may receive the first counting value CLKCNT<7:0> from the first counter 330. The flag signal generation unit 350 may compare a predetermined code value CTRL_CODE with the first counting value CLKCNT<7:0> received from the first counter 330 and block the first and second transmission paths based on the comparison result. A predetermined code value in less than the maximum counting value of the first counter 330 may be stored in a register such as a Mode Register Set (MRS), which is set by a device designer in advance, and the predetermined code value CTRL_CODE set as a comparison target of the first counting value CLKCNT<7:0> may change through a predetermined operation. The predetermined code value CTRL_CODE may be set differently based on the number of bits of the first counter 330 that is used.

The flag signal generation unit 350 may deactivate the flag signal CTRL_SIG when the first counting value CLKCNT<7:0> is not the same as the predetermined code value CTRL_CODE and activate the flag signal CTRL_SIG when the first counting value CLKCNT<7:0> is the same as the predetermined code value CTRL_CODE. The flag signal generation unit 350 may output the flag signal CTRL_SIG to the clock signal transmission unit 310, the target signal transmission unit 320 and the output block 400.

For example, when the deactivated flag signal CTRL_SIG is outputted to the clock signal transmission unit 310, the first counting signal CLK_SIGIN may be transmitted to the first counter 330 based on the clock signal CLK_SIG, the counter enable signal CNTEN and the deactivated flag signal CTRL_SIG, and the first counter 330 may perform a counting operation. When the deactivated flag signal CTRL_SIG is outputted to the target signal transmission unit 320, the second counting signal MS_SIGIN may be transmitted to the second counter 340 based on the target signal MS_SIG, the counter enable signal CNTEN and the deactivated flag signal CTRL_SIG, and the second counter 340 may perform a counting operation.

Furthermore, when the activated flag signal CTRL_SIG is outputted to the clock signal transmission unit 310, the first counting signal CLK_SIGIN may be deactivated based on the clock signal CLK_SIG, the counter enable signal CNTEN and the flag signal CTRL_SIG. The counting operation of the first counter 330 receiving the deactivated first counting signal CLK_SIGIN may stop. When the flag signal CTRL_SIG activated in the flag signal generation unit 350 is outputted to the target signal transmission unit 320, the second counting signal MS_SIGIN may be deactivated based on the target signal MS_SIG, the counter enable signal CNTEN and the activated flag signal CTRL_SIG. The counting operation of the second counter 340 receiving the deactivated second counting signal MS_SIGIN may stop.

The output block 400 may output the second counting value MSCNT<7:0> of the second counter 340 corresponding to a moment, to a predetermined data pad DQ<0>, when the flag signal CTRL_SIG is activated, that is, a moment when the first and second transmssion paths are blocked. The output block 400 may include a latching unit 410 and an output driving unit 420.

The latching unit 410 may receive the second counting value MSCNT<7:0> from the second counter 340 and the flag signal CTRL_SIG from the flag signal generation unit 350. When the flag signal CTRL_SIG is deactivated, the latching unit 410 may latch the second counting value MSCNT<7:0> received from the second counter 340, and when the flag signal CTRL_SIG is activated, the latching unit 410 may output the latched second counting value MSCNT<7:0>.

The output driving unit 420 may receive the second counting value MSCNT<7:0> from the latching unit 410. The output driving unit 420 may output the second counting value MSCNT<7:0> to the predetermined data pad DQ<0> in response to a read command RD_CMD. The second counting value MSCNT<7:0> outputted to the data pad DQ<0> may correspond to the second counting value MSCNT<7:0> at a moment when the flag signal CTRL_SIG is activated, which is a moment at which an overflow is set not to occur while the counting operation on the target signal MS_SIG is performed to measure a period of the second counting value MSCNT<7:0>.

Hereafter, an operation of the semiconductor device is described.

When a period of the target signal MS_SIG is measured, the counter enable signal CNTEN is activated. The clock signal transmission unit 310 and the target signal transmission unit 320 receive the counter enable signal CNTEN, and the clock signal CLK_SIG and the target signal MS_SIG, respectively, Additionally, the clock signal transmission unit 310 and the target signal transmission unit 320 receive the flag signal CTRL_SIG from the flag signal generation unit 350.

The flag signal generation unit 350 outputs the deactivated flag signal CTRL_SIG until the first counting value CLKCNT<7:0> obtained by counting the clock signal CLK_SIG reaches the predetermined code value CTRL_CODE, and it outputs the activated flag signal CTRL_SIG when the first counting value CLKCNT<7:0> is the same as the predetermined code value CTRL_CODE.

When the first counting value CLKCNT<7:0> does not reach the predetermined code value CTRL_CODE, the clock signal transmission unit 310 and the target signal transmission unit 320 receiving the deactivated flag signal CTRL_SIG transmit the clock signal CLK_SIG and the target signal MS_SIG to the first counter 330 and the second counter 340, respectively, based on the activated counter enable signal CNTEN, The first counter 330 performs a counting operation on the first counting signal CLK_SIGIN received from the clock signal transmission unit 310. The second counter 340 performs a counting operation on the second counting signal MS_SIGIN received from the target signal transmission unit 320. The first counter 330 outputs the number of times counted through a counting operation as the first counting value CLKCNT<7:0> to the flag signal generation unit 350. The second counter 340 outputs the number of times counted through a counting operation as the second counting value MSCNT<7:0> to the latching unit 410 of the output block 400. The flag signal generation unit 350 compares the first counting value CLKCNT<7:0> with the predetermined code value CTRL_CODE. As a comparison result, when the first counting value CLKCNT<7:0> is not the same as the predetermined code value CTRL_CODE, the flag signal generation unit 350 disables the flag signal CTRL_SIG and continues to perform the counting operations of the first counter 330 and the second counter 340. The latching unit 410 latches the second counting value MSCNT<7:0> received from the second counter 340 based on the deactivated flag signal CTRL_SIG.

Subsequently, when the first counting value CLKCNT<7:0> reaches the predetermined code value CTRL_CODE, the flag signal generation unit 350 outputs the flag signal CTRL_SIG. The activated flag signal CTRL_SIG is transmitted to the clock signal transmission unit 310, the target signal transmission unit 320 and the latching unit 410. The clock signal transmission unit 310 and the target signal transmission unit 320 set the first counting signal CLK_SIGIN and the second counting signal MS_SIGIN to a predetermined level in response to the flag signal CTRL_SIG regardless of the clock signal CLK_SIG and the target signal MS_SIG. The first counter 330 and the second counter 340 stop performing the counting operations based on the first counting signal CLK_SIGIN and the second counting signal MS_SIGIN that do not toggle and have the set level.

The latching unit 410 receiving the activated flag signal CTRL_SIG outputs the latched second counting value MSCNT<7:0> to the output driving unit 420. Subsequently, the second counting value MSCNT<7:0> is outputted to the data pad DQ<0> based on the read command RD_CMD.

When the predetermined code value CTRL_CODE is divided by the second counting value MSCNT<7:0> outputted to the data pad DQ<0>, the percentage that the target signal MS_SIG has in comparison with the clock signal CLK_ SIG, may be determined. The period of the target signal MS_SIG may be measured based on a clock cycle (tCK) value of the clock signal CLK_SIG.

In the semiconductor device in accordance with the embodiment of the present invention, although the operation times of the first counter 330 and the second counter 340 increase, an overflow of the counter does not occur as the first counter 330 and the second counter 340 are disabled after the counting operation is performed during a predetermined time regardless of the counter enable signal CNTEN. Thus, a measurement error of a target signal may be prevented from occurring.

Although a counting value of a target signal whose period may be measured is outputted based on a test mode in the embodiment of FIG. 1, the second counting value MSCNT<7:0> may be latched when the flag signal CTRL_SIG is deactivated, and the latched second counting value MSCNT<7:0> may be outputted when the flag signal CTRL_SIG is activated, based on the flag signal CTRL_SIG without the need of an external signal in the embodiment of FIG. 3.

Figure 4:
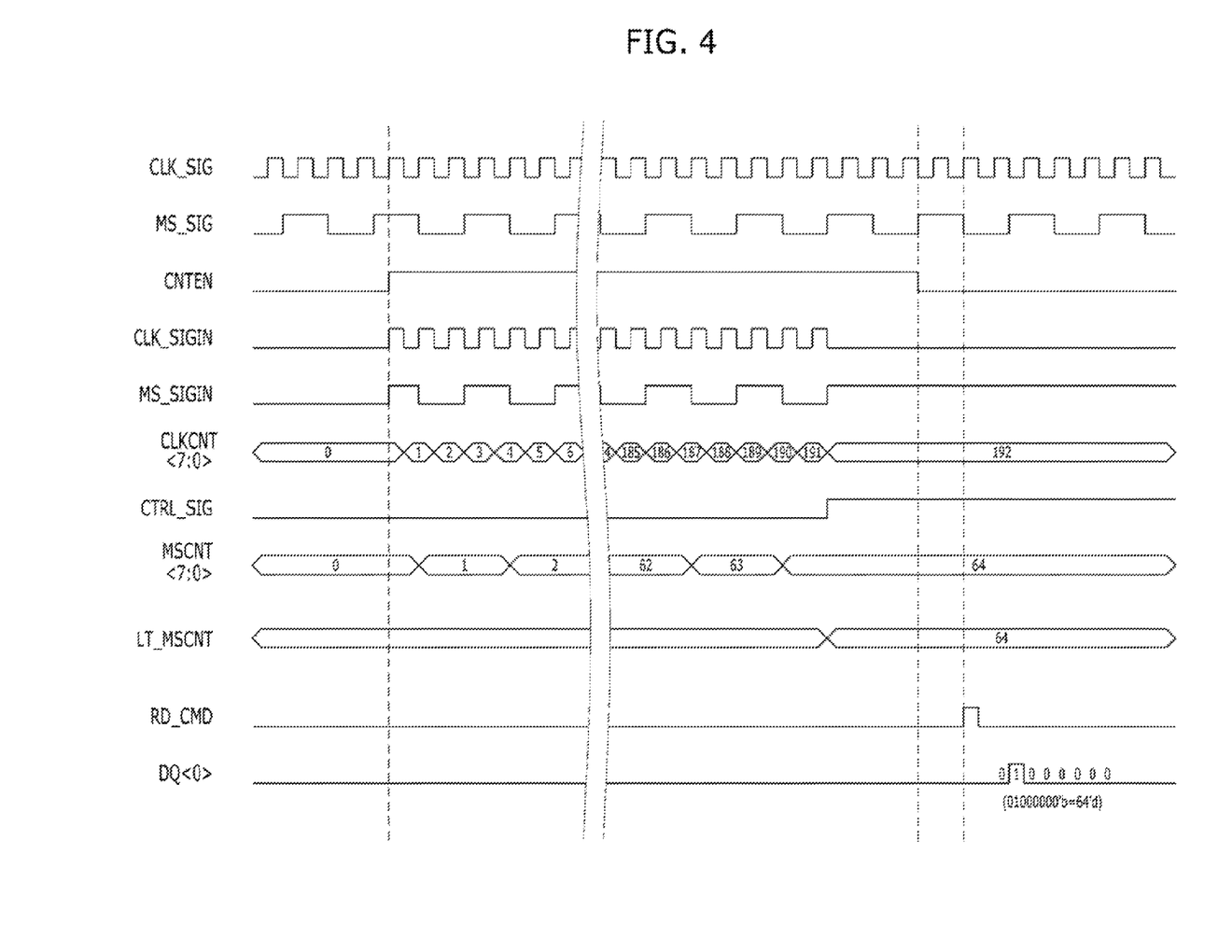
FIG. 4 is a timing diagram for describing an operation of the semiconductor device shown in FIG. 3.

FIG. 4 is a timing diagram for describing an operation of the semiconductor device shown in FIG. 3.

Referring to FIG. 4, an example of the semiconductor device in which the first counter has a 8-bit size, and the predetermined code value set in the flag signal generation unit 350 is set to the value of "192" which is a preceding value of the maximum value of "256" that the first counter may count, is described.

It may be seen that the counter enable signal CNTEN is activated to measure a period of the target signal MS_SIG through a counting operation. As the counter enable signal CNTEN is activated, the clock signal CLK_SIG is transmitted as the first counting signal CLK_SIGIN to the first counter and performs a counting operation. Additionally, as the counter enable signal CNTEN is activated, the target signal MS_SIG is transmitted as the second counting signal MS_SIGIN to the second counter and performs a counting operation. The first counter may output its counting value as the first counting value CLKCNT<7:0> to the flag signal generation unit. The second counter may output its counting value as the second counting value MSCNT<7:0> to the latching unit and be latched in the latching unit. When the first counting value CLKCNT<7:0> outputted from the first counter is the same as the predetermined code value of "192", the flag signal CTRL_SIG is activated, The first counting signal CLK_SIGIN and the second counting signal MS_SIGIN are fixed at a logic low level, and consequently the counting operations of the first and second counters stop based on the activated flag signal CTRL_SIG. A latched second counting value LT_MSCNT<7:0> corresponding to the activated flag signal CTRL_SIG is outputted to the data pad DQ<0> in response to the activated read command RD_CMD. The latched second counting value LT_MSCNT<7:0> outputted to the data pad DQ<0> is 64, in which there is a 3tCK difference between the latched second counting value LT MSCNT<7:0> of "64" and the predetermined code value of "192". A period of the target signal MS_SIG may be measured based on the clock cycle (tCK) value of the clock signal CLK_SIG.

In accordance with the embodiments of the present invention, the semiconductor device may prevent a measurement error of the signal from occurring due to an overflow of the counter since the overflow is not likely to occur, regardless of an enabling time of a counter for measuring a period of a signal.

Furthermore, dispositions and types of the logic gates and transistors described in the aforementioned embodiments may be implemented differently based on the polarity of the inputted signal.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

What is claimed is:

1. A semiconductor device, comprising:
    a counting detection block suitable for generating a counting value of a clock signal transmitted through a first transmission path and a counting value of a target signal transmitted through a second transmission path during a counter enable section, and blocking the first transmission path and the second transmission path based on a comparison result obtained by comparing a predetermined code value with the counting value of the clock signal; and
    an output block suitable for outputting the counting value of the target signal corresponding to a moment when the first and second transmission paths are blocked to a predetermined pad based on a test mode signal.

2. The semiconductor device of claim 1, wherein the counting detection block includes:
    a first counter suitable for performing counting operation of the clock signal transmitted through the first transmission path during the counter enable section;
    a second counter suitable for performing a counting operation of the target signal transmitted through the second transmission path during the counter enable section; and
    a flag signal generation unit suitable for comparing the predetermined code value with a counting value outputted from the first counter, generating a flag signal when the predetermined code value is the same as the counting value outputted from the first counter and blocking the first and second transmission paths based on the flag signal.

3. The semiconductor device of claim 2, wherein the counting detection block further includes:
 a clock signal transmission unit suitable for receiving the flag signal and the clock signal and transmitting the clock signal to the first counter when the flag signal is deactivated; and
 a target signal transmission unit suitable for receiving the flag signal and the target signal and transmitting the target signal to the second counter when the flag signal is deactivated.

4. The semiconductor device of claim 3, wherein the clock signal transmission unit sets the clock signal to a predetermined level and transmits the set clock signal to the first counter when the flag signal is activated.

5. The semiconductor device of claim 3, wherein the target signal transmission unit sets the target signal to a predetermined level and transmits the set target signal to the second counter when the flag signal is activated.

6. The semiconductor device of claim 1, wherein the output block includes;
 an output enable signal generation unit suitable for receiving the test mode signal and generating an output signal after the counter enable section;
 an input/output line transmission unit suitable for transmitting the counting value of the target signal to an input/output line based on the output signal; and
 an output driving unit suitable for outputting the counting value transmitted to the input/output line to the predetermined pad in response to a read command.

7. A semiconductor device, comprising:
 a counting detection block suitable for generating a counting value of a clock signal transmitted through a first transmission path and a counting value of a target signal transmitted through a second transmission path during a counter enable section and blocking the first transmission path and the second transmission path based on a flag signal generated based on a comparison result obtained by comparing a predetermined code value with the counting value of the clock signal; and
 an output block suitable for outputting the counting value of the target signal corresponding to an enabling moment of the flag signal to a predetermined pad when the flag signal is activated.

8. The semiconductor device of claim 7, wherein the counting detection block includes:
 a first counter suitable for performing a counting operation on the clock signal transmitted through the first transmission path during the counter enable section;
 a second counter suitable for performing a counting operation on the target signal transmitted through the second transmission path during the counter enable section; and
 a flag signal generation unit suitable for comparing the predetermined code value with a counting value outputted from the first counter, generating the flag signal when the predetermined code value is the same as the counting value outputted from the first counter and blocking the first and second transmission paths based on the flag signal.

9. The semiconductor device of claim 8, wherein the flag signal generation unit enables the flag signal when the predetermined code value is the same as the counting value of the first counter and disables the flag signal when the predetermined code value is not the same as the counting value of the first counter.

10. The semiconductor device of claim 8, wherein the counting detection block further includes:
 a clock signal transmission unit suitable for receiving the flag signal and the clock signal and transmitting the clock signal to the first counter when the flag signal is deactivated; and
 a target signal transmission unit suitable for receiving the flag signal and the target signal and transmitting the target signal to the second counter when the flag signal is deactivated.

11. The semiconductor device of claim 10, wherein the clock signal transmission unit sets the clock signal to a predetermined level to and transmits the set clock signal to the first counter when the flag signal is activated.

12. The semiconductor device of claim 10, wherein the target signal transmission unit sets the target signal to a predetermined level and transmits the fixed target signal to the second counter when the flag signal is activated.

13. The semiconductor device of claim 8, wherein the output block includes:
 a latching unit suitable for latching the counting value of the second counter when the flag signal is deactivated and outputting the latched counting value of the second counter when the flag signal is activated; and
 an output driving unit suitable for outputting the counting value transmitted from the latching unit to the predetermined pad in response to a read command.

14. A method for operating a semiconductor device, comprising
 performing counting operations on a clock signal and a target signal during a counter enable section;
 blocking the counting operations when a predetermined code value is the same as a counting value of the clock signal;
 outputting a counting value of the target signal corresponding to a moment when the counting operations are blocked; and
 measuring a period of the target input signal based on the predetermined code value and the counting value of the target signal.

15. A period measuring circuit, comprising:
 a clock signal transmission unit suitable for selectively transmitting a clock signal as a first counting signal based on a counter enable signal and a flag signal;
 a first counter suitable for counting the first counting signal to output a first counting value;
 a flag signal generation unit suitable for comparing the first counting value with a predetermined code to generate the flag signal;
 a target signal transmission unit suitable for selectively transmitting a target signal as a second counting signal based on the counter enable signal and the flag signal; and
 a second counter suitable for counting the second counting signal to output a second counting value.

16. The period measuring circuit of claim 15, wherein the clock signal and the target signal are blocked when the first counting signal is the same as the predetermined code value.

* * * * *